United States Patent [19]

Köhler et al.

[11] Patent Number: 5,155,150
[45] Date of Patent: Oct. 13, 1992

[54] BLENDS OF POLYARYLENE SULFIDES, DOLOMITE AND MALEIC IMIDES

[75] Inventors: Burkhard Köhler, Krefeld; Seisaku Imai, Leverkusen; Kurt Jeschke, Duesseldorf, all of Fed. Rep. of Germany

[73] Assignee: Bayer Aktiengesellschaft, Leverkusen, Fed. Rep. of Germany

[21] Appl. No.: 868,645

[22] Filed: Apr. 15, 1992

[30] Foreign Application Priority Data

Apr. 26, 1991 [DE] Fed. Rep. of Germany ....... 4113694

[51] Int. Cl.$^5$ .......................... C08K 13/02; C08K 5/34
[52] U.S. Cl. ..................... 524/94; 524/104; 524/436
[58] Field of Search ............ 524/94, 104, 436

[56] References Cited

U.S. PATENT DOCUMENTS 4,889,893 12/1989 Kobayashi et al. ................. 524/500
5,071,907 12/1991 Nakata et al. ....................... 524/588

Primary Examiner—Morton Foelak
Attorney, Agent, or Firm—Connolly and Hutz

[57] ABSTRACT

This invention relates to blends of polyarylene sulfides, maleic imides and dolomite. The blends are distinguished by good mechanical properties and are particularly suitable for the production of, for example, metallizable moldings.

16 Claims, No Drawings

BLENDS OF POLYARYLENE SULFIDES, DOLOMITE AND MALEIC IMIDES

This invention relates to blends of polyarylene sulfides, maleic imides and dolomite. The blends are distinguished by good mechanical properties and are particularly suitable for the production of, for example, metallizable moldings.

Polyarylene sulfides (PAS) are known (cf. for example U.S. Pat. No. 3,354,129, EP-A 171 021). They are inert, high-temperature-resistant thermoplastics which can be filled to a high degree, for example with glass fibers and/or other inorganic fillers. These polymers and, more particularly, polyphenylene sulfide (PPS) are being used to an increasing extent for applications hitherto reserved for thermosets.

PAS has unsatisfactory mechanical properties for certain applications in the injection-molding field. More particularly, flexural strength and tensile strength, outer fiber strain, impact strength and modulus of elasticity are often inadequate for practical purposes. Accordingly, it has proved to be of advantage to improve the above-mentioned properties of PAS, for example by blending with other thermoplastics, for example with polycarbonates (cf. for example JP-A 51 59952, EP-A 104 543, U.S. Pat. No. 4,021,596).

For certain applications, however, the property profile of blends of this type is not always entirely satisfactory.

Metallizable PAS blends have to meet particularly stringent requirements. They have to show high surface quality. Acidic outgassings can be prevented by basic fillers, for example by dolomite, even at relatively high temperatures. Outgassings can result in the formation of coatings on the metal layer. Dolomite-containing, glass-fiber-free blends of the type in question show poor toughness and outer fiber strain. The problem addressed by the present invention was to provide dolomite-containing compounds combining high toughness with high outer fiber strain.

It has now been found that blends of polyarylene sulfides (PAS), preferably polyphenylene sulfide (PPS), with dolomite and maleic imides, preferably selected tetramaleic imides, are distinguished by distinctly improved toughness. The increase in toughness is distinctly above the increase in toughness obtained in the presence of glass fibers or other fillers.

Accordingly, the present invention relates to blends of

A) 99.9 to 20% by weight and preferably 90 to 20% by weight polyarylene sulfides, preferably PPS, B) 0.1 to 40% by weight and preferably 0.5 to 5% by weight of a maleic imide corresponding to formula (I) and/or (II), preferably formula (II)

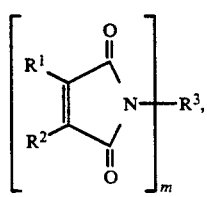
(I)

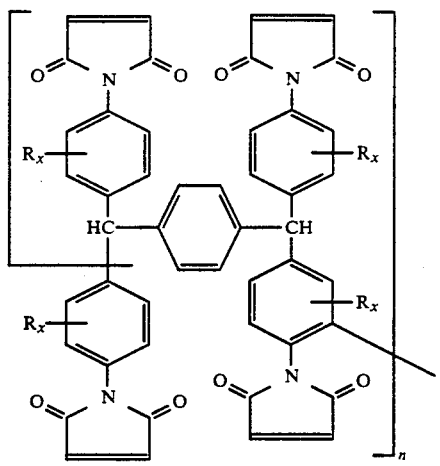
(II)

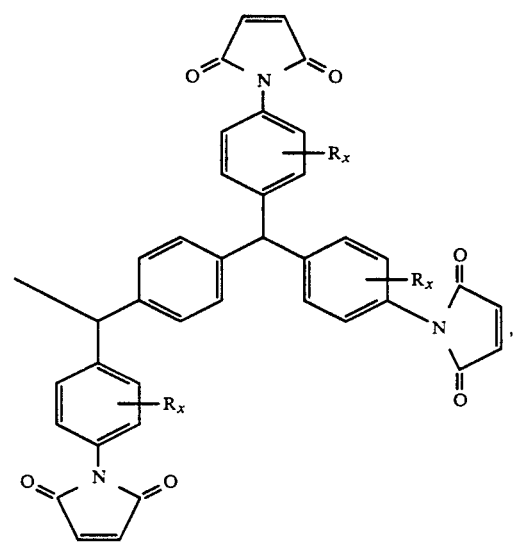

in which $R^1$ and $R^2$ may be the same or different and represent hydrogen, $C_{1-22}$ alkyl, preferably methyl, $C_{6-14}$ aryl, preferably phenyl, or $C_{7-22}$ aralkyl or $C_{7-22}$ alkylaryl, more preferably hydrogen, is an m-functional, preferably difunctional, radical containing 1 to 38 aliphatic carbon atoms which may even be arranged in rings and/or divalent aromatic radicals containing 6 to 24 carbon atoms and/or divalent aromatic-aliphatic and/or aliphatic-aromatic radicals containing 7 to 40 carbon atoms; two or more aromatic aliphatic rings may be linked by a chemical bond, an oxygen atom, a sulfur atom, a carbonyl group and/or a sulfone group, m is a number of 2 to 5, preferably 2, the R's may be the same or different and represent hydrogen, $C_{1-22}$ alkyl, preferably methyl, $C_{6-14}$ aryl, preferably phenyl, or $C_{1-22}$ aralkyl or $C_{7-22}$ alkylaryl, more preferably hydrogen or methyl, x is the number 1, 2, 3 or 4, preferably the number 1, n is a number of 0 to 10, preferably 0, with the proviso that, where (n =1), the free valencies of formula (II) are saturated with hydrogen and up to ¼ of the maleic imide structures of formulae (I) and/or (II) can be replaced by non-cyclized maleic amide structures, and C) 5 to 79.9% by weight and preferably 9.9 to 79.9% by weight dolomite.

The polyarylene sulfides are preferably linear and free from sulfone groups. Poly-p-phenylene sulfide is particularly preferred.

Examples of compounds of formula (I) according to the invention are 1,6-bis-(maleicimido)-hexane, 1,4-bis-(maleicimido)-cyclohexane, 1,4-bis-(maleicimido)-benzene, 4,4'-bis-(maleicimido)-biphenyl, bis-(4-maleicimidophenyl)methane, 2,2-bis-(4-maleicimido-phenyl)-propane, 1,3-bis-(maleicimido)-cyclohexane, 1,5-bis-(maleicimido)-naphthalene, 1,3-bis-(maleicimido)-benzene, bis-(maleicimido)methane, 1,2-bis-(maleicimido)-ethane, di-(4-maleicimido-phenyl)-sulfone, di-(3-maleicimidophenyl)-sulfone, 4,4'-bis-(maleicimido)-benzophenone, 3,3'-bis-(maleicimido)-benzophenone, 4,4'-bis-(maleicimido)-diphenyl ether, 4,4'-bis-(maleicimido)-diphenyl sulfide, etc.

One example of compounds of formula (II) according to the invention is the polyimide MP-2000 X ® (a product of Mitsubishi Petrochemical Co.).

Dolomites are magnesium carbonate double salts which occur in nature as a mineral.

The maleic imides according to the invention may be produced from maleic anhydride and amine, for example in accordance with GB-A 1,137,592.

Other suitable additives are, for example, polyethylene waxes, esters of montanic acids (E waxes), carbon black, graphite or carbon. Other typical additives include pigments, flow aids, nucleating agents, stabilizers, etc.

The blends according to the invention may be produced in the usual way by extrusion.

They may be processed by standard methods to moldings, semifinished products, fibers, films, profiles, circuit boards, etc. The blends according to the invention may generally be used with advantage for applications where minimal acidic outgassings and high toughness are important.

The present invention also relates to the use of the blends according to the invention for the production of metallizable PAS blends and preferably for the production of aluminium-coated reflectors for lights and lamps. Reflectors of the blends according to the invention are distinguished by unusually high toughness for mineral-filled PAS blends.

EXAMPLES

The blends according to the invention were produced at 320° C. in a Werner & Pfleiderer at ZSK 32 twin-screw extruder.

The PPS used had a melt viscosity of 65 PA.s (306° C.), shear stress = 1,000 s$^{-1}$, and was produced in accordance with EP-A 171 021.

The blends were granulated and injection-molded to test specimens (for example measuring 80 × 104 mm). The test specimens were tested for impact strength $a_n$ (reversed notched ISO 180).

COMPARISON EXAMPLE 1

39.5% by weight PPS, 0.5% by weight E wax and 60% by weight ground dolomite were mixed (E wax = standard demolding wax, such as montanic acid ester). Impact strength measured 7 kJ/m$^2$.

EXAMPLE 1

38.5% by weight PPS, 1% by weight 4,4'-bis-(maleicimido)-diphenyl methane, 0.5% by weight E wax and 60% by weight ground dolomite were mixed. Impact strength measured 14 kJ/m$^2$.

EXAMPLE 2

38.5% by Weight PPS, 1% by weight of the polymaleic imide MP-2000 X ® (a product of Mitsubishi Petrochemical Co.) and a polymaleic imide corresponding to formula II with R = methyl were mixed. Impact strength measured 21 kJ/m$^2$.

The toughness of the dolomite-containing compounds is doubled by addition of 4,4'-bis-(maleicimido)-diphenyl methane and tripled by MP-2000 X ®.

COMPARISON EXAMPLE 2a

60% by weight PPS and 40% by weight glass fibers (CS 7916 ®, a product of Bayer AG) were mixed. Impact strength measured 30 kJ/m$^2$.

COMPARISON EXAMPLE 2b

59% by weight PPS and 40% by weight glass fibers (CS 7916 ®, a product of Bayer AG) were mixed. Impact strength measured 48 kJ/m$^2$.

COMPARISON EXAMPLE 2c

59% by weight PPS, 40% by weight glass fibers (CS 7916 ®) and 1% by weight MP-2000 X ® were mixed. Impact strength measured 49 kJ/m$^2$.

In glass-fiber-containing compounds, 4,4'-bis-(maleicimido)-diphenyl methane and MP-2000 X ® improved toughness by a factor of only 1.6 to to 1.7.

COMPARISON EXAMPLE 3a

40% by weight PPS, 40% by weight mica and 20% by weight CS 7916 ® were mixed. Impact strength measured 11 kJ/m$^2$.

COMPARISON EXAMPLE 3b

39% by weight PPS, 40% by weight mica, 20% by weight CS 7916 ® and 1% by weight 4,4-bis-(maleicimido)-diphenyl methane were mixed. Impact strength measured 13.6 kJ/m$^2$.

It follows from this that the improvement in toughness obtained by maleic imides in dolomite-containing compounds is particularly clear which is all the more surprising insofar as unmodified dolomite-containing compounds show particularly poor toughness values, the addition of maleic imide increasing toughness beyond the level of mica-filled compounds. The blends of Examples or 2, preferably Example 2, can be processed to reflectors which may be used in particular in the automotive field where the improved toughness level is particularly desirable.

We claim:

1. Blends of
   A) 99.9 to 20% by weight polyarylene sulfides,
   B) 0.1 to 40% by weight of a maleic imide corresponding to formula (I) and/or (II)

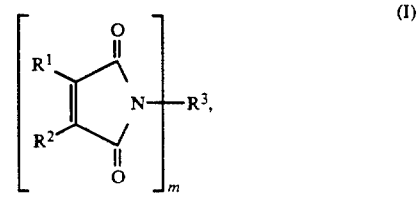

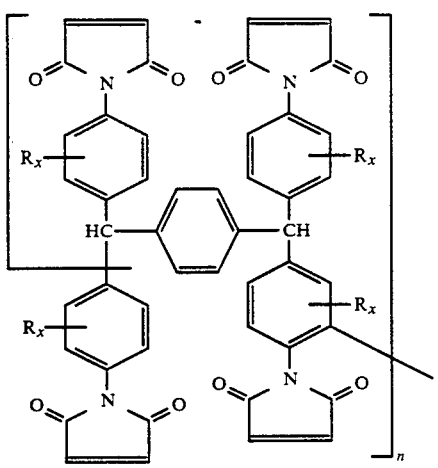

(II)

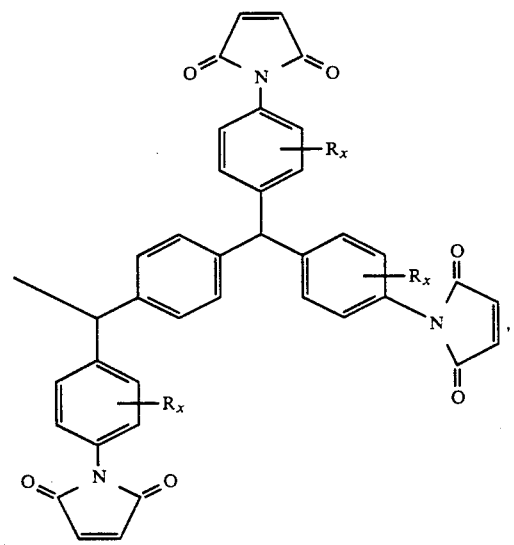

in which

R$^1$ and R$^2$ may be the same or different and represent hydrogen, C$_{1-22}$ alkyl, C$_{6-14}$ aryl, or C$_{7-22}$ aralkyl or C$_{7-22}$ alkylaryl, R$^3$ is an m-functional, radical containing 1 to 38 aliphatic carbon atoms which may even be arranged in rings and/or divalent aromatic radicals containing 6 to 24 carbon atoms and/or divalent aromatic-aliphatic and/or aliphatic-aromatic radicals containing 7 to 40 carbon atoms; two or more aromatic aliphatic rings may be linked by a chemical bond, an oxygen atom, a sulfur atom, a carbonyl group and/or a sulfone group, m is a number of 2 to 5, the R's may be the same or different and represent hydrogen, C$_{1-22}$ alkyl, C$_{6-14}$ aryl, or C$_{1-22}$ aralkyl or C$_{7-22}$ alkylaryl, x is the number 1, 2, 3 or 4, n is a number of 0 to 10, with the proviso that, where (n=1), the free valencies are saturated with hydrogen (H), and C) 5 to 79.9% by weight dolomite.

2. A molding comprising the blends as claimed in claim 1.

3. A metallized article comprising the blends as claimed in claim 1.

4. A circuit board comprising the blends as claimed in claim 1.

5. The blends as claimed in claim 1, wherein formula II is used.

6. The blends as claimed in claim 1, wherein R$^3$ is difunctional.

7. The blends as claimed in claim 1, wherein said polyarylene sulfides are polyphenylene sulfide.

8. The blends as claimed in claim 1, wherein the polyarylene sulfides are 90-20% by weight.

9. The blends as claimed in claim 1, wherein component B) is 0.5 to 5% by weight of a maleic imide.

10. The blends as claimed in claim 1, wherein R$^1$ and R$^2$ are selected from the group consisting of methyl, phenyl or hydrogen.

11. The blends as claimed in claim 1, wherein R$^1$ and R$^2$ are hydrogen.

12. The blends as claimed in claim 1, wherein m is 2.

13. The blends as claimed in claim 1, wherein x is 1.

14. The blends as claimed in claim 1, wherein n is 0.

15. The blends as claimed in claim 1, wherein said polyarylene sulfide is poly-p-phenylene sulfide.

16. The blends as claimed in claim 1, wherein component (C) is 9.9 to 79.9% by weight dolomite.

* * * * *